US012757698B2

(12) United States Patent
Xu et al.

(10) Patent No.: US 12,757,698 B2
(45) Date of Patent: Oct. 6, 2026

(54) METHOD FOR GAPFILL

(71) Applicant: Applied Materials, Inc., Santa Clara, CA (US)

(72) Inventors: Yi Xu, San Jose, CA (US); Yu Lei, Belmont, CA (US); Aixi Zhang, Sunnyvale, CA (US); Rongjun Wang, Dublin, CA (US)

(73) Assignee: Applied Materials Inc., Santa Clara, CA (US)

( * ) Notice: Subject to any disclaimer, the term of this patent is extended or adjusted under 35 U.S.C. 154(b) by 599 days.

(21) Appl. No.: 18/083,075

(22) Filed: Dec. 16, 2022

(65) Prior Publication Data

US 2024/0178062 A1 May 30, 2024

Related U.S. Application Data

(63) Continuation-in-part of application No. 18/070,185, filed on Nov. 28, 2022, now abandoned.

(51) Int. Cl.
*H10W 20/00* (2026.01)
*H10P 14/43* (2026.01)

(52) U.S. Cl.
CPC ........... *H10W 20/056* (2026.01); *H10P 14/43* (2026.01)

(58) Field of Classification Search
CPC ......... H01L 21/28556; H01L 21/28562; H01L 21/76876; H01L 21/76877
See application file for complete search history.

(56) References Cited

U.S. PATENT DOCUMENTS

| | | | |
|---|---|---|---|
| 2004/0115913 A1 | 6/2004 | Jung et al. | |
| 2004/0115929 A1 | 6/2004 | Lim | |
| 2005/0042829 A1* | 2/2005 | Kim | H01L 21/28556 257/E21.17 |
| 2012/0077342 A1 | 3/2012 | Gao et al. | |
| 2021/0320034 A1 | 10/2021 | Lei et al. | |
| 2022/0068709 A1 | 3/2022 | Wang et al. | |

OTHER PUBLICATIONS

PCT International Search Report and Written Opinion for PCT/US2023/035658 dated Feb. 16, 2024.

* cited by examiner

*Primary Examiner* — Tony Tran
(74) *Attorney, Agent, or Firm* — Moser Taboada

(57) ABSTRACT

A method of gap fill may include depositing a sacrificial Si layer in an opening of a feature and on a field of a substrate. In addition, the method may include depositing a metal layer in the opening and on the field, where at least a portion of the sacrificial Si layer is replaced with the metal layer. The method may also include depositing a metal gapfill material in the opening and on the field directly over the metal layer, where the metal gapfill material completely fills the opening.

9 Claims, 5 Drawing Sheets

METHOD FOR GAPFILL

RELATED APPLICATION

This application is a continuation-in-part of and claims the benefit of priority to U.S. patent application Ser. No. 18/070,185 filed Nov. 28, 2022, the entire disclosure of which is incorporated by reference herein.

FIELD

Embodiments of the present principles generally relate to methods for gapfill of semiconductor substrates.

BACKGROUND

When semiconductor devices are manufactured, the devices are formed with contacts to allow electrical connectivity to the device by other devices or for electrical connections external to a chip or circuit. The contacts are made with metal materials that promote electrical conductivity. The higher the conductivity, the less the resistivity. The inventors have observed that current manufacturing techniques produce contacts with high resistivity which reduces electrical conductivity and may cause thermal issues due to resistive heating in the contact, resulting in poor performance and reduced reliability.

Thus, the inventors have provided improved methods for gapfill when forming contacts having low resistivity and increased reliability.

SUMMARY

Embodiments of the present disclosure relate to methods for gapfill of features in a substrate. In embodiments, a method for gapfill may include depositing a sacrificial Si layer in an opening of a feature and on a field of a substrate; depositing a metal layer in the opening and on the field, where at least a portion of the sacrificial Si layer is replaced with the metal layer; and depositing a metal gapfill material in the opening and on the field directly over the metal layer, where the metal gapfill material completely fills the opening.

In embodiments, a method for gapfill may include depositing a sacrificial Si layer atop a base metal layer in an opening of a feature and on a field of a substrate; performing an atomic layer deposition process atop the sacrificial Si layer to replace Si atoms with metal atoms and create a metal layer atop the base metal layer in the opening and on the field, where greater than or equal to about 95 wt % of the sacrificial Si layer is replaced with the metal layer; and depositing a metal gapfill material in the opening and on the field directly over the metal layer, where the metal gapfill material completely fills the opening. Other embodiments include corresponding computer systems, apparatus, and computer programs recorded on one or more computer storage devices, each configured to perform the actions of the methods.

BRIEF DESCRIPTION OF THE DRAWINGS

Embodiments of the present principles, briefly summarized above and discussed in greater detail below, can be understood by reference to the illustrative embodiments of the principles depicted in the appended drawings. The appended drawings illustrate only typical embodiments of the principles and are thus not to be considered limiting of scope, for the principles may admit to other equally effective embodiments.

DETAILED DESCRIPTION

The methods provide for metal gapfill in which the metal gapfill material completely fills the opening of a feature of a substrate.

In embodiments, a method for metal gapfill, comprises depositing a sacrificial Si layer in an opening of a feature and on a field of a substrate. After which, a metal layer is deposited in the opening and on the field of the substrate, wherein at least a portion of the sacrificial Si layer is replaced with the metal layer. A metal gapfill material is then deposited in the opening and on the field directly over the metal layer, such that the metal gapfill material completely fills the opening.

In embodiments, the depositing the metal layer comprises atomic layer deposition, comprising contacting the sacrificial Si layer with a metal precursor according to formula I;

$$MXa; \qquad (I);$$

wherein:

M is a Group 6 through Group 9 metal;

X is a fluorine or chlorine; and a is from 2 to 6.

In embodiments, the metal precursor comprises tungsten hexafluoride.

In embodiments, the metal layer is deposited using thermal atomic layer deposition or plasma enhanced atomic layer deposition. In embodiments, the metal layer is deposited using thermal atomic layer deposition or plasma enhanced atomic layer deposition at a temperature of greater than or equal to about 200° C.

In embodiments, the metal layer has a thickness of less than or equal to about 15 nm. In embodiments, the metal layer is a conformal metal layer having a thickness from about 5 nm to about 10 nm.

In embodiments, the metal layer comprises tungsten.

In embodiments, the sacrificial Si layer is deposited over a base metal layer comprising the same metal as the metal layer. In embodiments, the base metal layer is deposited anisotropically via physical vapor deposition or chemical vapor deposition. In embodiments, the base metal layer is deposited anisotropically via physical vapor deposition or chemical vapor deposition, followed by the depositing the sacrificial Si layer, in an integrated process without a vacuum break therebetween.

In embodiments, the sacrificial Si layer is deposited using plasma enhanced atomic layer deposition. In embodiments, the sacrificial Si layer is a sacrificial conformal Si layer having a thickness of less than or equal to about 4 nm.

In embodiments, the metal gapfill material comprises the same metal as the metal layer. In embodiments, the metal gapfill material is deposited via physical vapor deposition or chemical vapor deposition. In embodiments, greater than or equal to about 95 wt % of the sacrificial Si layer is replaced with the metal layer. In embodiments, the method for metal gapfill is performed in an integrated tool without vacuum break between the depositing of the sacrificial Si layer, the depositing of the metal layer, and the depositing of the metal gapfill material.

Figure 1:
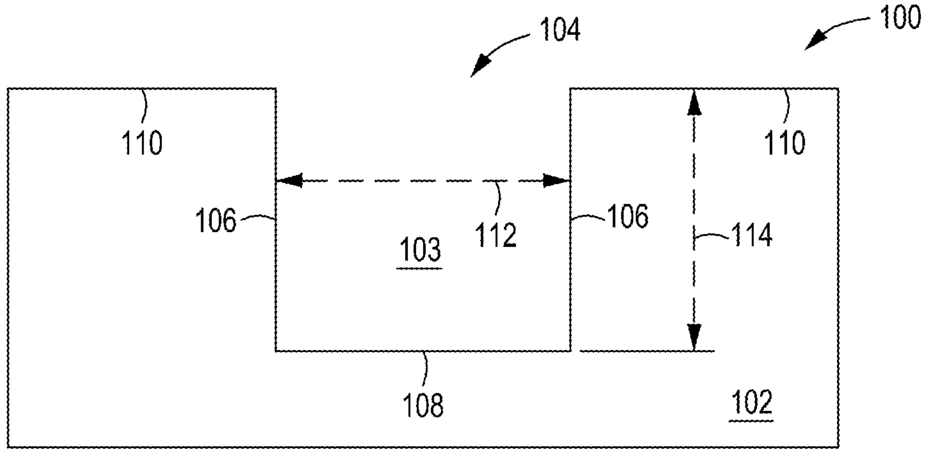
FIG. 1 depicts a cross-sectional view of a feature formed in a substrate in accordance with embodiments disclosed herein.
Figure 4A:
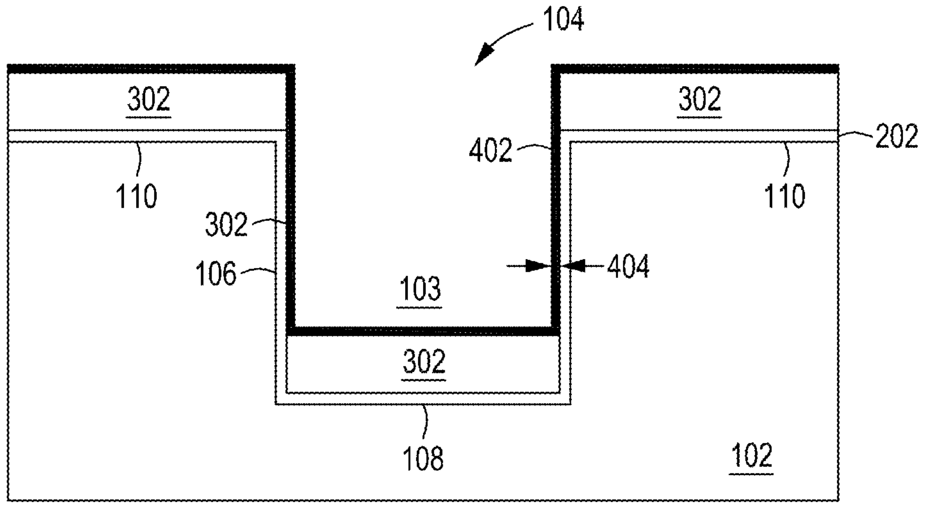
FIG. 4*a* depicts a cross-sectional view of a sacrificial Si layer deposited on the base metal layer in accordance with embodiments disclosed herein.
Figure 4B:
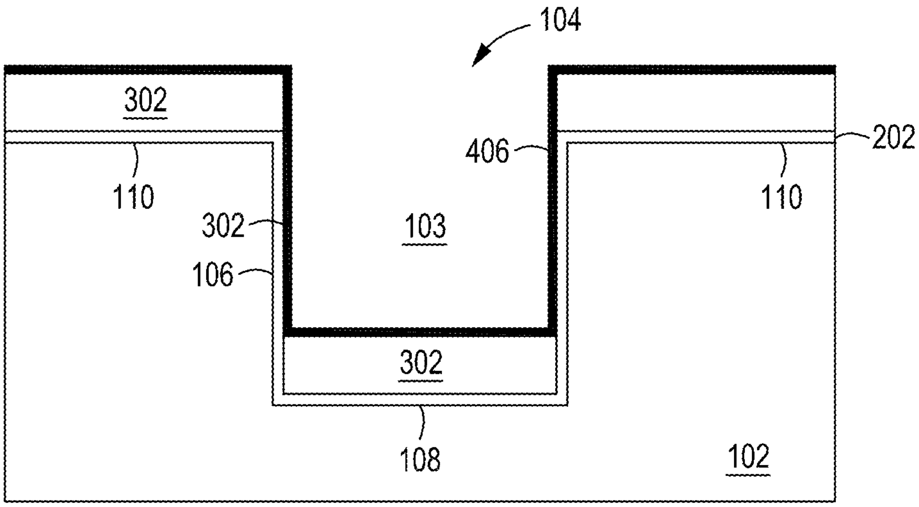
FIG. 4*b* depicts a cross-sectional view of a metal layer deposited on and replacing the sacrificial Si layer in accordance with embodiments disclosed herein.
Figure 4C:
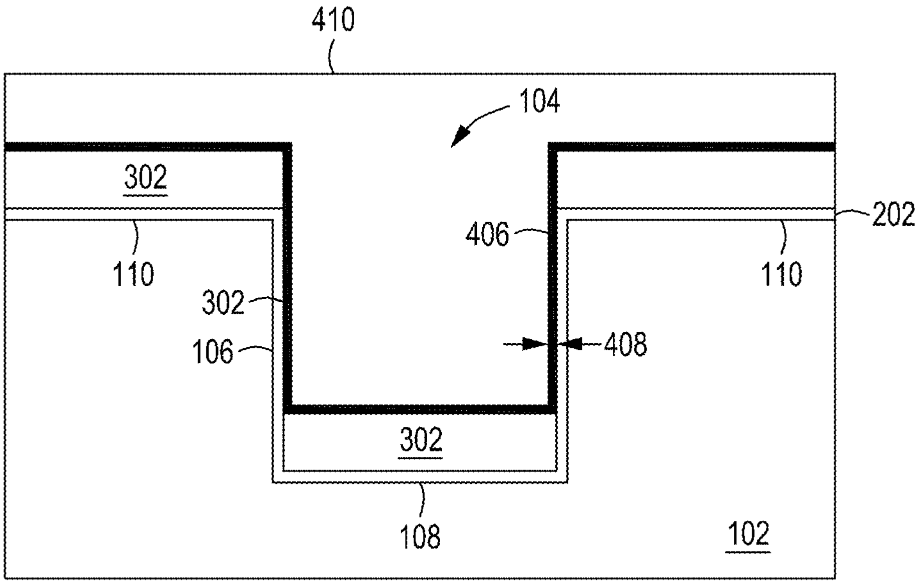
FIG. 4*c* depicts a metal gapfill material deposited on metal layer in the feature and on the substrate in accordance with embodiments disclosed herein.
Figure 5:
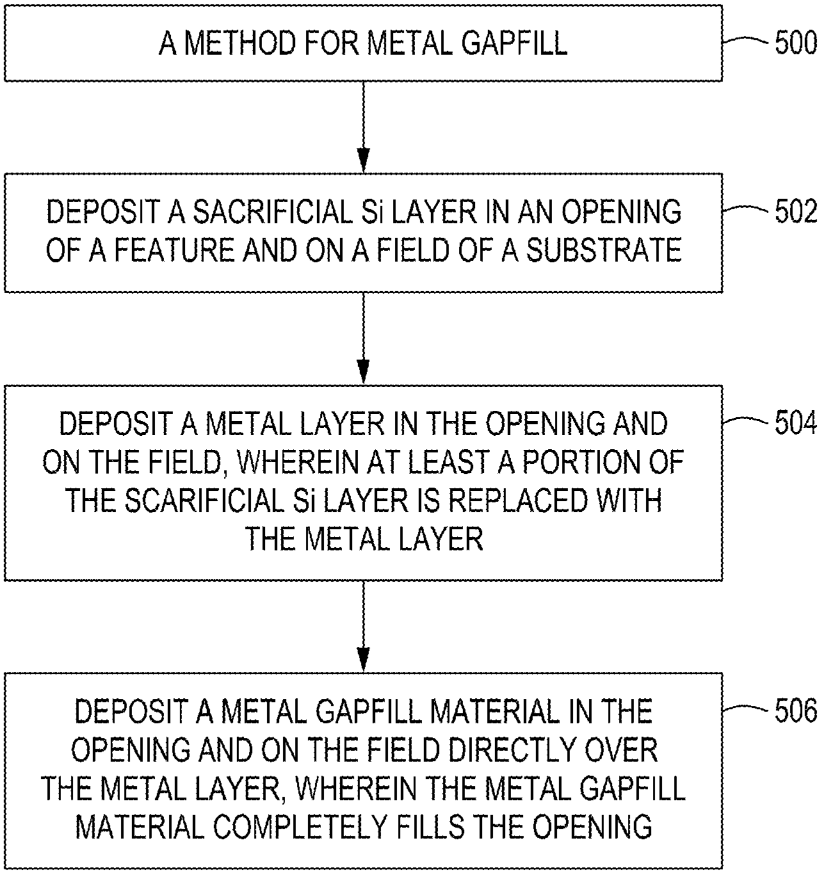
FIG. 5 is a flowchart depicting a method for metal gapfill in accordance with embodiments disclosed herein.

In FIG. 5, a method of depositing a metal gapfill (method 500) in accordance with some embodiments is depicted. References are made to FIGS. 1-4 during the discussion of the method 500, which may be within an opening 103 of a feature of a substrate. As shown in FIG. 1, a feature of a substrate 100, may include a feature 104 in the form of an opening 103 having sides 106 and a bottom 108, which is formed on or within a substrate 102. The representative feature 104 in the example is an opening 103 in a field 110 of the substrate 102. The feature 104 has a height 114 and a width 112.

Figure 2:
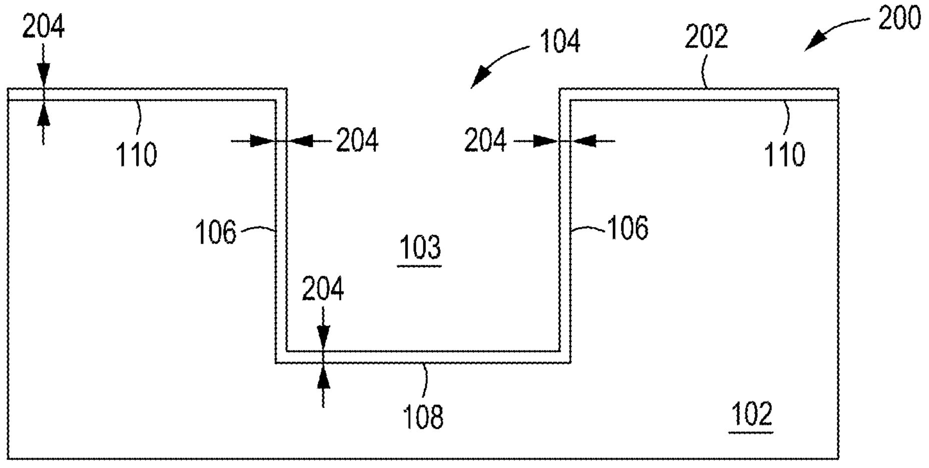
FIG. 2 depicts a cross-sectional view of an underlayer deposited on the feature and the substrate in accordance with embodiments disclosed herein.

In embodiments, as shown in FIG. 2, the feature 104 of the substrate 102 may further include an underlayer 202, which may be deposited using an atomic layer deposition (ALD) process, a physical vapor deposition (PVD) process, or a chemical vapor deposition (CVD) process. In embodiments, the underlayer 202 is a conformal layer deposited via atomic layer deposition. In embodiments, the underlayer may comprise, but is not limited to, titanium nitride, tungsten nitride, and/or tungsten carbon nitride and the like. The materials used for the underlayer 202 are generally oxides that have high resistivity which decreases the conductivity of a contact. By using a thin layer (i.e., less than approximately 10 microns), the resistivity of the underlayer 202 is dramatically reduced. Metal depositions such as PVD tungsten and CVD tungsten have a resistivity of approximately 15 ohm-cm or less. Whereas titanium nitride has a resistivity of approximately 200 to 500 ohm-cm. Reduction of the thickness of the underlayer 202 has a dramatic effect on the contact resistivity.

Figure 3:
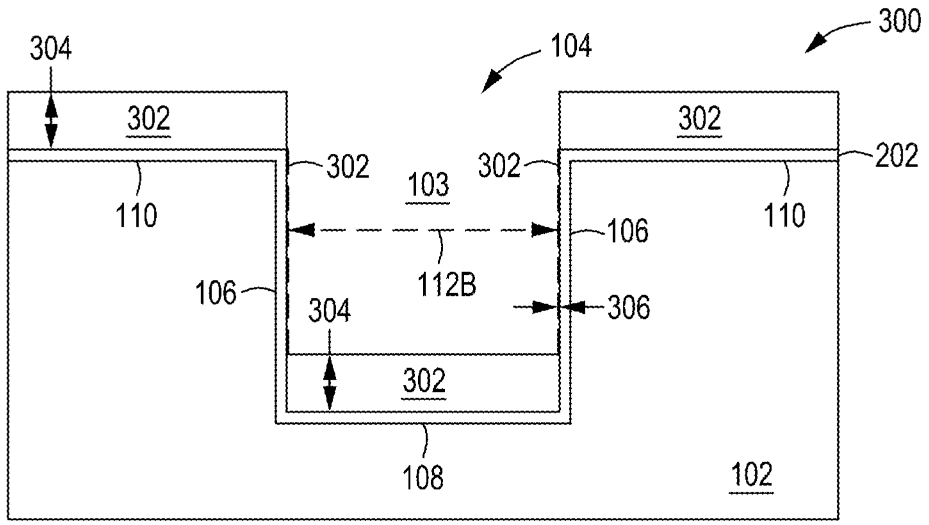
FIG. 3 depicts a cross-sectional view of a base metal layer deposited on the feature and the substrate in accordance with embodiments disclosed herein.

As shown in FIG. 3, in embodiments, the feature 104 of the substrate 102 may further include a base metal layer 302, which in embodiments is a non-conformal layer deposited on the bottom 108 of the feature 104 and on the field 110 of the substrate 102 using an anisotropic deposition process as depicted in a view 300 of FIG. 3. Because the deposition process is directional, a first thickness 304 of the base metal layer 302 may be approximately the same on the field 110 of the substrate 102 and on the bottom 108 of the feature 104. In some embodiments, the first thickness 304 may be approximately 30 microns to approximately 50 microns. In some embodiments, the first thickness 304 may be approximately 30 microns to approximately 40 microns. In some embodiments, the first thickness 304 may be approximately 32 microns to approximately 37 microns. As shown in FIG. 3, a second thickness 306 of the base metal layer 302 on the sides 106 of the feature 104 is negligible and may be discontinuous due to the directionality of the deposition process.

In some embodiments, the base metal layer 302 may be deposited using a PVD process and the like. In some embodiments, the PVD process is self-biasing to provide the anisotropic non-conformal deposition of the base metal layer 302. In some embodiments, the PVD process may use an applied bias to the substrate to further influence the PVD deposition. The base metal layer 302 forms on the underlayer 202 on the field 110 of the substrate 102 and on the underlayer 202 at the bottom 108 of the feature 104. Any deposition of the base metal layer 302 on the underlayer 202 on the sides 106 of the feature 104 may be discontinuous and is negligible in thickness. In some embodiments, the base metal layer 302 is formed of a metallic material such as, but not limited to any Group 6 through Group 9 metal, or the base metal layer 302 may comprise the same metal as the metal layer 406 (See FIG. 4*a*) and the metal gapfill material 410 (See FIG. 4*c*) discussed herein. In some embodiments, the base metal layer 302 is formed from a Group 6 through Group 9 metal, or from tungsten and/or cobalt, and in embodiments the base metal layer 302 is formed from tungsten.

As is also shown in FIG. 5, block 502, the method 500 includes depositing a sacrificial Si layer 402 in an opening 103 of the feature 104 and on the field 110 of the substrate 102 as shown in FIG. 4*a*. In embodiments, the sacrificial Si layer 402 is deposited using plasma enhanced atomic layer deposition. In embodiments, the sacrificial Si layer is deposited using plasma enhanced atomic layer deposition using silane as the Si layer precursor. In embodiments, the sacrificial Si layer 402 is a conformal layer. In embodiments, the sacrificial Si layer 402 has a thickness 404 of less than or equal to about 4 nm. In embodiments, the sacrificial Si layer 402 has a thickness 404 from about 0.5 nm to 3 nm or from about 1 nm to about 2 nm.

As shown in FIG. 5, block 504, the method 500 further includes depositing a metal layer 406 in the opening 103 of the feature 104 and on the field 110, where at least a portion of the sacrificial Si layer 402 is replaced with the metal layer 406 as shown in FIG. 4*b*.

In embodiments, the metal layer 406 is deposited via atomic layer deposition, and comprises contacting the sacrificial Si layer 402 with a metal precursor according to formula I;

$$MXa; \quad \text{(I)}$$

wherein M is a Group 6 through Group 9 metal;
wherein X is a fluorine or chlorine; and
a is from 2 to 6.

In embodiments, the metal precursor comprises tungsten hexafluoride. The inventors have discovered that by using ALD with metal halides, e.g., tungsten hexafluoride, the tungsten atoms replace Si atoms, creating a continuous tungsten seeding layer according to the reaction: $Si+WF_a \rightarrow W(m)+SiF_a(g)\uparrow$.

In embodiments, the metal layer 406 is deposited using thermal atomic layer deposition. In embodiments, the metal layer 406 is deposited using plasma enhanced atomic layer deposition. In embodiments, the metal layer 406 is deposited at a temperature of greater than or equal to about 200° C., or greater than or equal to about 300° C.

In embodiments, greater than or equal to about 95 wt % of the sacrificial Si layer 402 is replaced with the metal layer 406. In embodiments, greater than or equal to about 99 wt %, or greater than or equal to about 99.5 wt % of the sacrificial Si layer 402 is replaced with the metal layer 406.

In embodiments, the metal layer 406 has a thickness 408 of less than or equal to about 15 nm.

In embodiments, the metal layer 406 is a conformal layer. In embodiments, the metal layer 406 is a conformal metal layer having a thickness from about 5 nm to about 10 nm. In embodiments, the metal layer 406 comprises tungsten. In embodiments, the metal layer 406 is, or consists essentially of tungsten. In embodiments, the base metal layer 302 comprises, or is the same metal as the metal layer 406.

As further shown in FIG. 5, block 506, the method 500 may include depositing a metal gapfill material 410 (FIG. 4*c*) in the opening and on the field directly over the metal layer 406, where the metal gapfill material 410 completely fills the opening 103 of the feature 104.

In embodiments, the metal gapfill material 410 completely fills the opening 103 of the feature 104 without voids. In embodiments, the metal gapfill material 410 may be, but is not limited to, tungsten and/or cobalt and the like. In embodiments, the metal gapfill material 410 comprises tungsten. In embodiments, the metal gapfill material 410 is, or consists essentially of tungsten. In embodiments, the base metal layer 302, the metal layer 406, and the metal gapfill material 410 are all the same metal. In embodiments, each of the base metal layer 302, the metal layer 406, and the metal gapfill material 410 comprise tungsten. In embodiments, each of the base metal layer 302, the metal layer 406, and the metal gapfill material 410 are, or consists essentially of tungsten. In embodiments, the metal gapfill material 410 is deposited via physical vapor deposition or chemical vapor deposition. In embodiments, the metal gapfill material 410 is deposited via chemical vapor deposition.

The inventors have found that a gapfill method according to embodiments results in an inside structure of all tungsten contact, without a high resistance layer as may result when a sacrificial Si layer 402 is not used. Further, the chemical vapor deposition tungsten of the metal gapfill material 410 that grows on the atomic layer deposition tungsten layer 406 has a low resistance of less than about 5 microohms per $mm^2$. Furthermore, the metal gapfill material 410 completely fills the feature 104 without the formation of voids.

Figure 6:
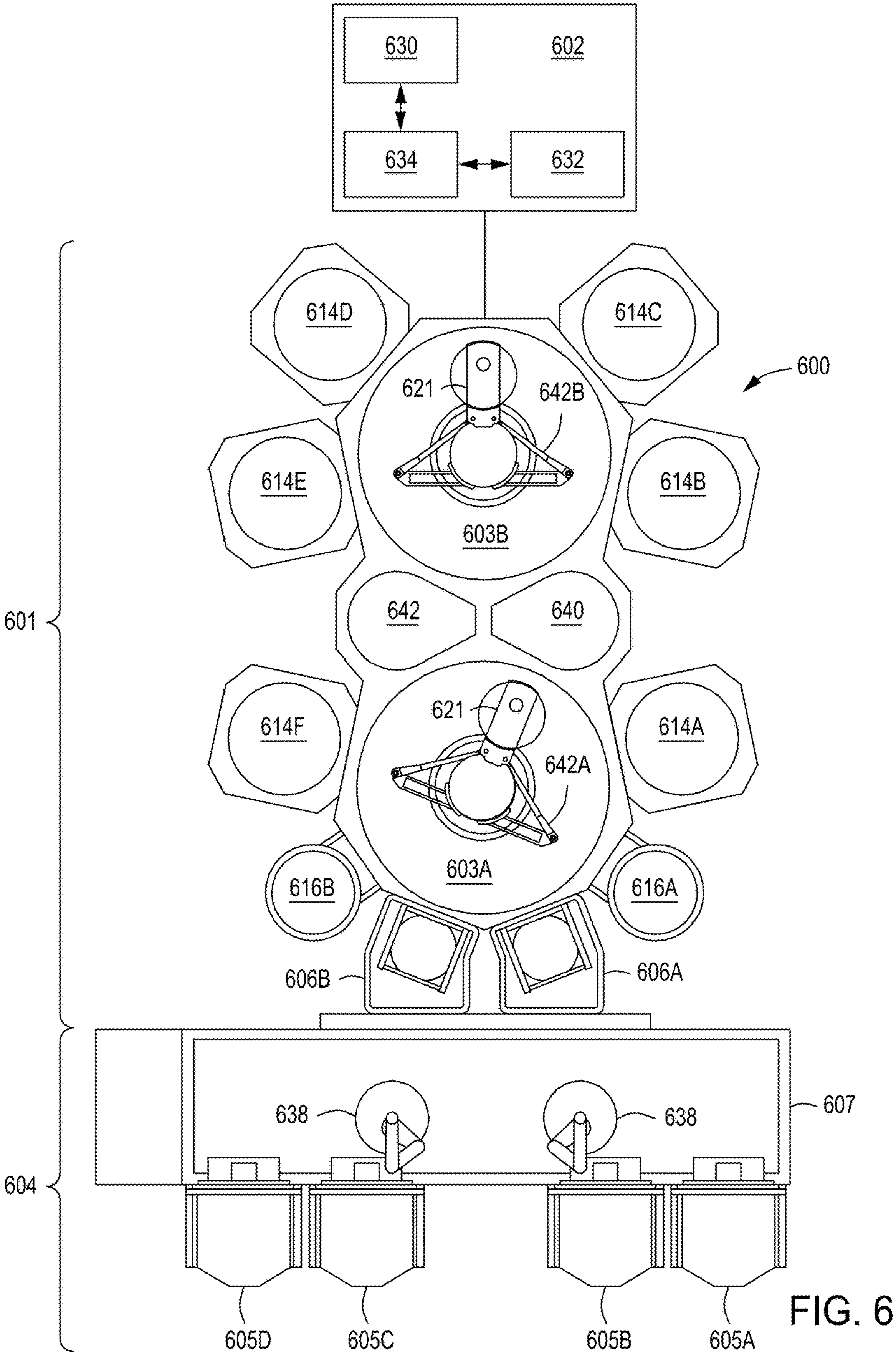
FIG. 6 depicts an integrated tool in accordance with embodiments disclosed herein.

The methods described herein may be performed in individual process chambers that may be provided in a standalone configuration or as part of a cluster tool, for example, the integrated tool 600 (i.e., cluster tool) described below with respect to FIG. 6. In embodiments, the method 500 according to one or more embodiments is performed in an integrated tool without vacuum break between the depositing of the sacrificial Si layer 402, the depositing of the metal layer 406, and the depositing of the metal gapfill material 410. The advantage of using an integrated tool 600 is that there is no vacuum break between chambers and, therefore, no requirement to degas and pre-clean a substrate before treatment in a chamber. For example, in some embodiments the methods discussed above may advantageously be performed in an integrated tool such that there are limited or no vacuum breaks between processes, limiting or preventing contamination of the substrate such as oxidation and the like. The integrated tool 600 includes a vacuum-tight processing platform 601, a factory interface 604, and a system controller 602. The processing platform 601 comprises multiple processing chambers, such as 614A, 613B, 614C, 614D, 614E, and 614F operatively coupled to a vacuum substrate transfer chamber (transfer chambers 603A, 603B). The factory interface 604 is operatively coupled to the transfer chamber 603A by one or more load lock chambers (two load lock chambers, such as 606A and 606B shown in FIG. 6).

In some embodiments, the factory interface 604 comprises at least one docking station 607, at least one factory interface robot 638 to facilitate the transfer of the semiconductor substrates. The docking station 607 is configured to accept one or more front opening unified pod (FOUP). Four FOUPS, such as 605, 605B, 605C, and 605D are shown in the embodiment of FIG. 6. The factory interface robot 638 is configured to transfer the substrates from the factory interface 604 to the processing platform 601 through the load lock chambers, such as 606A and 606B. Each of the load lock chambers 606A and 606B have a first port coupled to the factory interface 604 and a second port coupled to the transfer chamber 603A. The load lock chamber 606A and 606B are coupled to a pressure control system (not shown) which pumps down and vents the load lock chambers 606A and 606B to facilitate passing the substrates between the vacuum environment of the transfer chamber 603A and the substantially ambient (e.g., atmospheric) environment of the factory interface 604. The transfer chambers 603A, 603B have vacuum robots 642A, 642B disposed in the respective transfer chambers 603A, 603B. The vacuum robot 642A is capable of transferring substrates 621 between the load lock chamber 606A, 606B, the processing chambers 614A and 614F and a cooldown station 640 or a pre-clean station 642. The vacuum robot 642B is capable of transferring substrates 621 between the cooldown station 640 or pre-clean station 642 and the processing chambers 614B, 614C, 614D, and 614E.

In some embodiments, the processing chambers 614A, 614B, 614C, 614D, 614E, and 614F are coupled to the transfer chambers 603A, 603B. The processing chambers 614A, 614B, 614C, 614D, 614E, and 614F may comprise, for example, atomic layer deposition process chambers, physical vapor deposition process chambers, chemical vapor deposition chambers, annealing chambers, or the like. The chambers may include any chambers suitable to perform all or portions of the methods described herein, as discussed above, in one or more ALD deposition chambers, non-conformal layer PVD deposition chambers, and CVD deposition chambers, and the like. In some embodiments, one or more optional service chambers (shown as 616A and 616B) may be coupled to the transfer chamber 603A. The service chambers 616A and 616B may be configured to perform other substrate processes, such as degassing, orientation, substrate metrology, cool down, and the like.

The system controller 602 controls the operation of the tool 600 using a direct control of the process chambers 614A, 614B, 614C, 614D, 614E, and 614F or alternatively, by controlling the computers (or controllers) associated with the process chambers 614A, 614B, 614C, 614D, 614E, and 614F and the tool 600. In operation, the system controller 602 enables data collection and feedback from the respective chambers and systems to optimize performance of the tool 600. The system controller 602 generally includes a Central Processing Unit (CPU) 630, a memory 634, and a support circuit 632. The CPU 630 may be any form of a general-purpose computer processor that can be used in an industrial setting. The support circuit 632 is conventionally coupled to the CPU 630 and may comprise a cache, clock circuits, input/output subsystems, power supplies, and the like. Software routines, such as a method as described above may be stored in the memory 634 and, when executed by the CPU 630, transform the CPU 630 into a specific purpose computer (system controller) 602. The software routines may also be stored and/or executed by a second controller (not shown) that is located remotely from the tool 600.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

EMBODIMENTS

Accordingly, the present disclosure includes the following embodiments, among others as recited in the appended claims.

E1. A method for metal gapfill, comprising:

depositing a sacrificial Si layer in an opening of a feature and on a field of a substrate;

depositing a metal layer in the opening and on the field, wherein at least a portion of the sacrificial Si layer is replaced with the metal layer; and depositing a metal gapfill material in the opening and on the field directly over the metal layer, wherein the metal gapfill material completely fills the opening.

E2. The method according to Embodiment E1, wherein the depositing the metal layer comprises atomic layer deposition, comprising contacting the sacrificial Si layer with a metal precursor according to formula I;

$$MX_a; \quad (I)$$

wherein M is a Group 6 through Group 9 metal;

wherein X is fluorine or chlorine; and a is from 2 to 6.

E3. The method according to Embodiment E1 or E2, wherein the metal precursor comprises tungsten hexafluoride.

E4 The method according to any of Embodiments E1 through E3, wherein the metal layer is deposited using thermal atomic layer deposition or plasma enhanced atomic layer deposition, at a temperature of greater than or equal to about 200° C.

E5. The method according to any of Embodiments E1 through E4, wherein the metal layer has a thickness of less than or equal to about 15 nm.

E6. The method according to any of Embodiments E1 through E5, wherein the metal layer is a conformal metal layer having a thickness from about 5 nm to about 10 nm.

E7. The method according to any of Embodiments E1 through E6, wherein the metal layer comprises tungsten.

E8. The method according to any of Embodiments E1 through E7, wherein the sacrificial Si layer is deposited over a base metal layer comprising the same metal as the metal layer.

E9. The method according to any of Embodiments E1 through E8, wherein the base metal layer is deposited anisotropically via physical vapor deposition or chemical vapor deposition, followed by the depositing the sacrificial Si layer, in an integrated process without a vacuum break therebetween.

E10. The method according to any of Embodiments E1 through E9, wherein the sacrificial Si layer is deposited using plasma enhanced atomic layer deposition.

E11. The method according to any of Embodiments E1 through E10, wherein the sacrificial Si layer is a sacrificial conformal Si layer having a thickness of less than or equal to about 4 nm.

E12. The method according to any of Embodiments E1 through E11, wherein the metal gapfill material comprises the same metal as the metal layer.

E13. The method according to any of Embodiments E1 through E12, wherein the metal gapfill material is deposited via physical vapor deposition or chemical vapor deposition.

E14. The method according to any of Embodiments E1 through E13, wherein greater than or equal to about 95 wt % of the sacrificial Si layer is replaced with the metal layer.

E15. The method according to any of Embodiments E1 through E14, performed in an integrated tool without vacuum break between the depositing of the sacrificial Si layer, the depositing of the metal layer, and the depositing of the metal gapfill material.

E16. A method for metal gapfill, comprising:

depositing a sacrificial Si layer atop a base metal layer in an opening of a feature and on a field of a substrate;

performing an atomic layer deposition process atop the sacrificial Si layer to replace Si atoms with metal atoms and create a metal layer atop the base metal layer in the opening and on the field, wherein greater than or equal to about 95 wt % of the sacrificial Si layer is replaced with the metal layer; and depositing a metal gapfill material in the opening and on the field directly over the metal layer, wherein the metal gapfill material completely fills the opening.

E17. The method according to Embodiment E16, wherein the base metal layer, the metal layer, and the metal gapfill material are all the same metal.

E18. The method according to any of Embodiments E16 through E17, wherein each of the base metal layer, the metal layer, and the metal gapfill material comprise tungsten.

E19. The method according to any of Embodiments E16 through E18, wherein each of the base metal layer, the metal layer, and the metal gapfill material are tungsten.

E20. A non-transitory, computer readable medium having instructions stored thereon that, when executed, cause a method for metal gapfill to be performed according to any of Embodiments E1 through E19.

E21. A non-transitory, computer readable medium having instructions stored thereon that, when executed, cause a method for metal gapfill to be performed, the method comprising:

depositing a sacrificial Si layer in an opening of a feature and on a field of a substrate;

depositing a metal layer in the opening and on the field, wherein at least a portion of the sacrificial Si layer is replaced with the metal layer; and depositing a metal gapfill material in the opening and on the field directly over the metal layer, wherein the metal gapfill material completely fills the opening.

While the foregoing is directed to embodiments of the present principles, other and further embodiments of the principles may be devised without departing from the basic scope thereof.

What is claimed is:

1. A method for metal gapfill, comprising: depositing a conformal sacrificial Si layer having a thickness of less than or equal to about 4 nm in an opening of a feature and on a field of a substrate;

depositing a conformal metal layer in the opening and on the field, wherein at least 95 wt % of the sacrificial Si layer is replaced with the conformal metal layer; and depositing a metal gapfill material in the opening and on the field directly over the conformal metal layer, wherein the metal gapfill material completely fills the opening;

wherein the depositing the conformal metal layer comprises atomic layer deposition, comprising contacting the sacrificial Si layer with a metal precursor according to formula I;

$MXa$;

(I) wherein M is cobalt, wherein X is fluorine or chlorine; and a is from 2 to 6; and wherein the conformal sacrificial Si layer is deposited over a base metal layer comprising the same metal as the conformal metal layer.

2. The method of claim 1, wherein the conformal metal layer is deposited using thermal atomic layer deposition or plasma enhanced atomic layer deposition, at a temperature of greater than or equal to about 200° C.

3. The method of claim 1, wherein the conformal metal layer has a thickness of less than or equal to about 15 nm.

4. The method of claim 1, wherein the conformal metal layer has a thickness from about 5 nm to about 10 nm.

5. The method of claim 1, wherein the base metal layer is deposited anisotropically via physical vapor deposition or chemical vapor deposition, followed by the depositing the conformal sacrificial Si layer, in an integrated process without a vacuum break therebetween.

6. The method of claim 1, wherein the conformal sacrificial Si layer is deposited using plasma enhanced atomic layer deposition.

7. The method of claim 1, wherein the metal gapfill material comprises the same metal as the conformal metal layer.

8. The method of claim 1, wherein the metal gapfill material is deposited via physical vapor deposition or chemical vapor deposition.

9. The method of claim 1, performed in an integrated tool without vacuum break between the depositing of the conformal sacrificial Si layer, the depositing of the conformal metal layer, and the depositing of the metal gapfill material.

* * * * *